United States Patent [19]
Plastow

[11] Patent Number: 5,547,274
[45] Date of Patent: Aug. 20, 1996

[54] MODULATED LIGHT SOURCE WITH A LINEAR TRANSFER FUNCTION

[75] Inventor: Robert J. Plastow, Cambridge, Mass.

[73] Assignee: Orchard Communications Inc., Wallingford, Conn.

[21] Appl. No.: 493,458

[22] Filed: Mar. 14, 1990

[51] Int. Cl.$^6$ .................................................. G02B 6/26
[52] U.S. Cl. ............................................. 385/15; 385/123
[58] Field of Search ............................. 350/96.15, 96.16, 350/96.29; 455/610, 611, 612

[56] References Cited

U.S. PATENT DOCUMENTS

| | | | |
|---|---|---|---|
| 4,530,603 | 7/1985 | Shaw et al. | 350/96.16 |
| 4,588,296 | 5/1986 | Cahill et al. | 350/96.15 X |
| 4,671,604 | 6/1987 | Soref | 350/96.29 X |
| 4,697,146 | 9/1987 | Extance et al. | 350/96.29 X |
| 4,741,587 | 5/1988 | Jewell et al. | 350/96.29 X |
| 4,879,479 | 11/1989 | Frazier et al. | 350/96.29 X |
| 4,960,319 | 10/1990 | Dankowych | 350/96.29 |

*Primary Examiner*—William L. Sikes
*Assistant Examiner*—Phan T. Heartney

[57] ABSTRACT

Distortion in an optical transmission system is significantly reduced by the use of two modulatable optical sources with non-ideal transfer functions of electric signal to light. The output of the first modulator is sampled and then delayed using an optical delay line. The sampled signal is compared with the input signal to generate an electrical error signal. This error signal is then used to modulate the second optical source. The output of this second modulatable optical source is then combined with the delayed output from the first optical source in an optical coupler in such a way that the departures from linearity (which form the error signal) are removed, giving a linear transfer function of electric signal to light through the entire system. The first optical source is chosen to have high power and low noise. The second source is chosen to be low power, moderate noise. The error signal generator and optical combiner are chosen such that most of the final optical output comes from the first optical source, giving a linear, high power, low noise optical signal at the output of the system.

6 Claims, 4 Drawing Sheets

PREFERRED EMBODIMENT OF INVENTION

GENERAL SCHEMATIC OF INVENTION

FIG. 2 PREFERRED EMBODIMENT OF INVENTION

IMPLEMENTATION USING MACH-ZEHNDER INTERFEROMETER WITH DIRECTIONAL COUPLER OUTPUT

Carrier to noise ratio vs optical path loss
60 channel AM-VSB C.A.T.V. signal 5,547,274

MODULATED LIGHT SOURCE WITH A LINEAR TRANSFER FUNCTION

DESCRIPTION OF INVENTION

The purpose of the invention is to provide a light source whose output intensity varies linearly as a function of an input electrical signal carrying video (or other) information at frequencies in excess of several hundred megahertz. The output of the light source is fed into an optical fiber and carried as an amplitude modulated signal, in contrast to prior art designs which primarily use frequency modulation of a subcarrier to avoid problems due to the non-linearity of the light source modulators available.

The invention comprises:

1) a first modulatable optical source with a non-ideal transfer function, such as a waveguide Mach-Zehnder interferometer or a laser diode;

2) an optical delay line to delay the output of the first optical modulator;

3) an error signal generator which compares the non-ideal signal from the first optical source with the original input signal and provides an error signal output;

4) a second, different, modulatable optical source which is modulated by the output of the error signal generator; and 5) an optical combiner, which combines the delayed optical signal from 1) with the modulated optical output from 4) in such a way that the departures from linearity (which form the error signal) are removed, giving a linear transfer function of electrical signal to light through the complete system.

The first optical source is chosen to have high power and low noise. The second source is chosen to be low power, moderate noise. The error signal generator and optical combiner are chosen such that most of the final optical output comes from the first optical source, giving a linear, high power, low noise optical signal at the output of the system.

BRIEF DESCRIPTION OF THE DRAWINGS

The invention will now be described in greater detail, and by way of example, with reference to the accompanying drawings, in which.

Similar components in FIGS. 1, 2, 3, are given the same reference numerals. Where FIGS. 2, 3 give a more detailed listing of components than FIG. 1 these are given new reference numerals.

DETAILED TECHNICAL DESCRIPTION

The prior art in fiber optic transmission systems has utilized a variety of different devices to perform the function of transforming the input electrical signal into the transmitted optical signal. Such devices include laser diodes, light emitting diodes and waveguide Mach-Zehnder interferometers. All of these devices have a non-ideal transfer function from electrical signal to optical signal. This leads to added distortion in the transmitted signal.

In the prior art, the presence of this added distortion meant that either a low specification had to be placed on the linearity of the complete system, reducing its area of application, or the electrical signal had to be first converted into a form that was insensitive to added distortion. Such forms include digital coding and frequency modulated subcarriers. This increased the cost of the complete system and restricted the format of the incoming signals that it was able to accept.

There exists a specific requirement for transmission of signals in cable television (CATV) systems in an amplitude modulated vestigial sideband (am-vsb) format, where the linearity requirements cannot be met by the prior art. This invention is designed to perform this function, but is equally applicable to the transmission of any modulated electrical signal through optical fiber.

The prior art also includes the demonstration of the technique of optical feedforward using two identical modulated optical sources. This was not capable of meeting the specific requirement for cable television systems.

Figure 1:
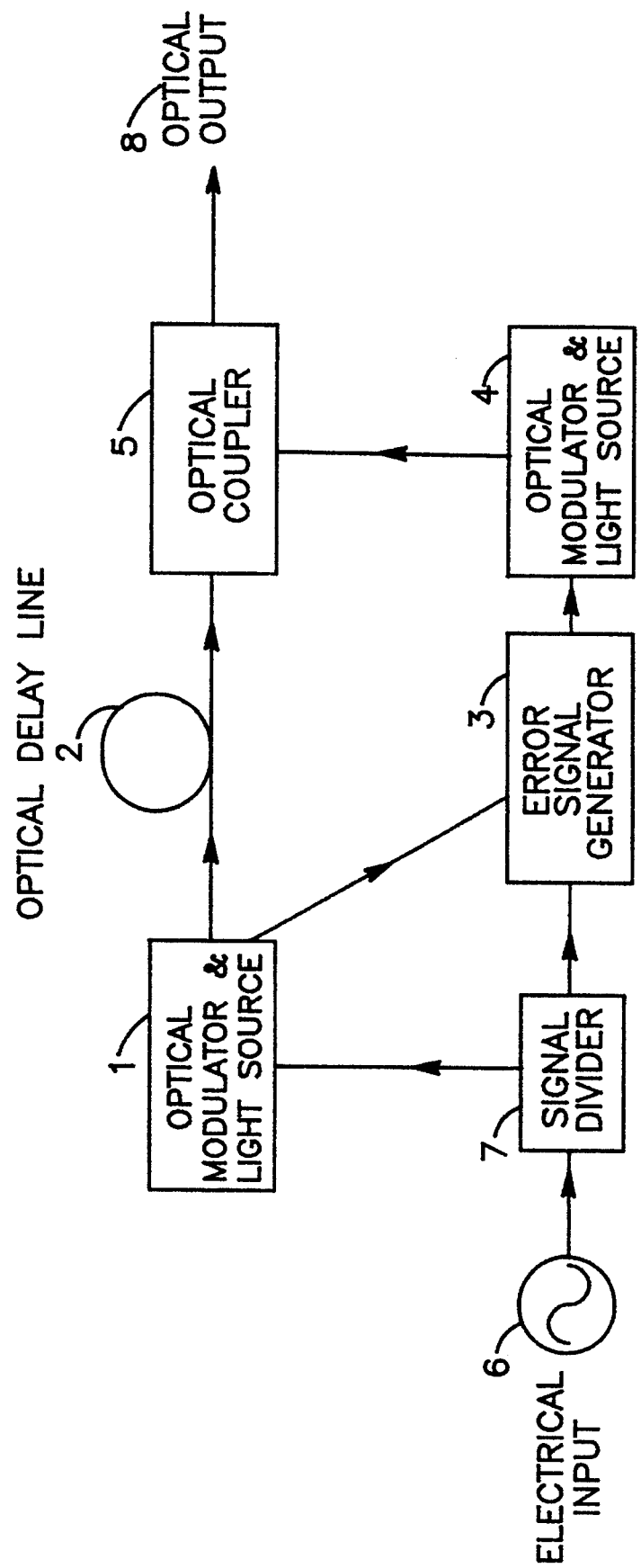
FIG. 1 is a general schematic of the invention.

The invention is shown in FIG. 1.

The invention comprises:

1) a first modulatable optical source 1 with a non-ideal transfer function, such as a waveguide Mach-Zehnder interferometer or a laser diode;

2) an optical delay line 2 to delay the output of the first optical modulator;

3) an error signal generator 3 which compares the non-ideal signal from the first optical source 1 with the original input signal 6 by means of a signal divider 7 and provides an error signal output;

4) a second, different, modulatable optical source 4 which is modulated by the output of the error signal generator 3; and 5) an optical combiner 5, which combines the delayed optical signal from 1 with the modulated optical output from 4 in such a way that the departures from linearity (which form the error signal) are removed, giving a linear transfer function of electrical signal to light through the complete system.

The first optical source 1 is chosen to have high power and low noise. The second source 4 is chosen to be low power, moderate noise. The error signal generator 3 and optical combiner 5 are chosen such that most of the final optical output 8 comes from the first optical source 1, giving a linear, high power, low noise optical signal at the output 8 of the system.

PREFERRED EMBODIMENT

Figure 2:
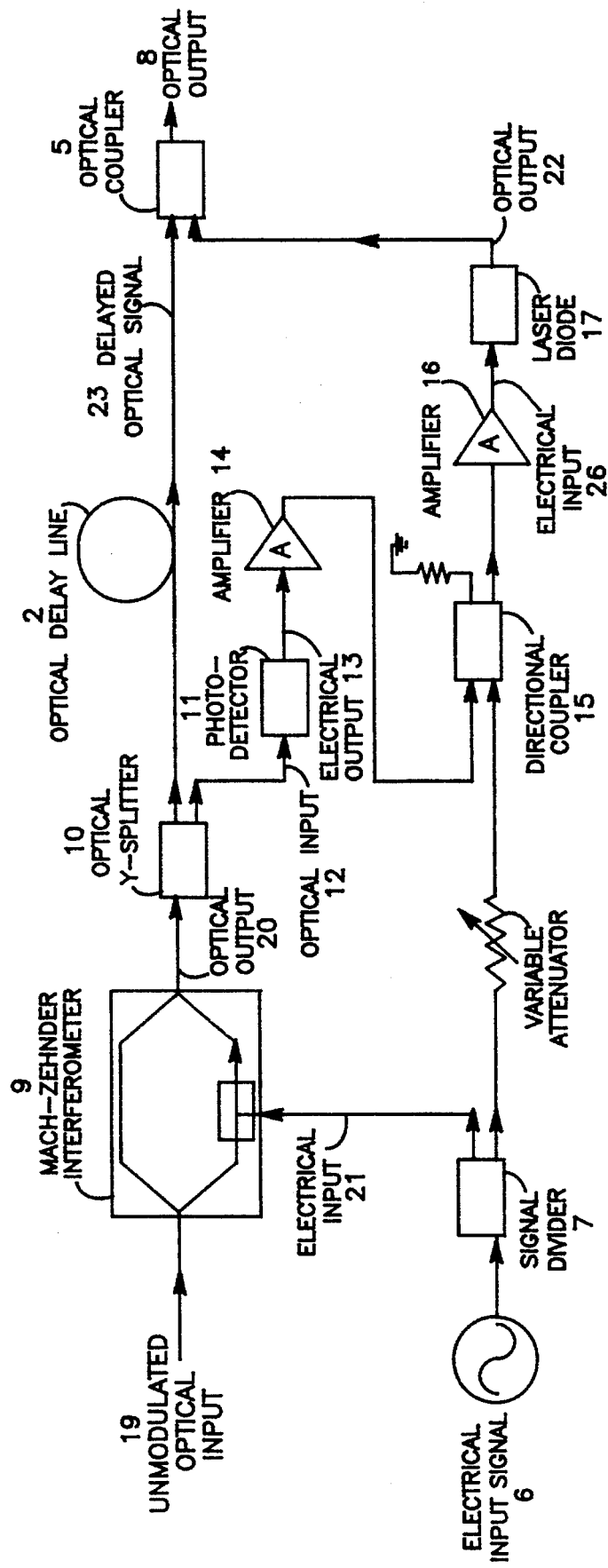
FIGS. 2 and 3 are more detailed schematics of two alternative versions of the preferred embodiment of the invention.

The preferred embodiment is shown in FIG. 2. It comprises:

1) A waveguide Mach-Zehnder interferometer 9.

2) Single mode optical fiber 2

3) A method to divert a proportion of the modulated light 10, followed by a detector 11 to convert this light 12 to electric current 13, followed by an amplification stage 14, followed by a directional coupler 15 to subtract a sample of the input signal 6, followed by a second amplifier 16 to drive the second modulatable optical source 17.

4) A semiconductor diode laser 17

5) An optical coupler 5.

Figure 3:
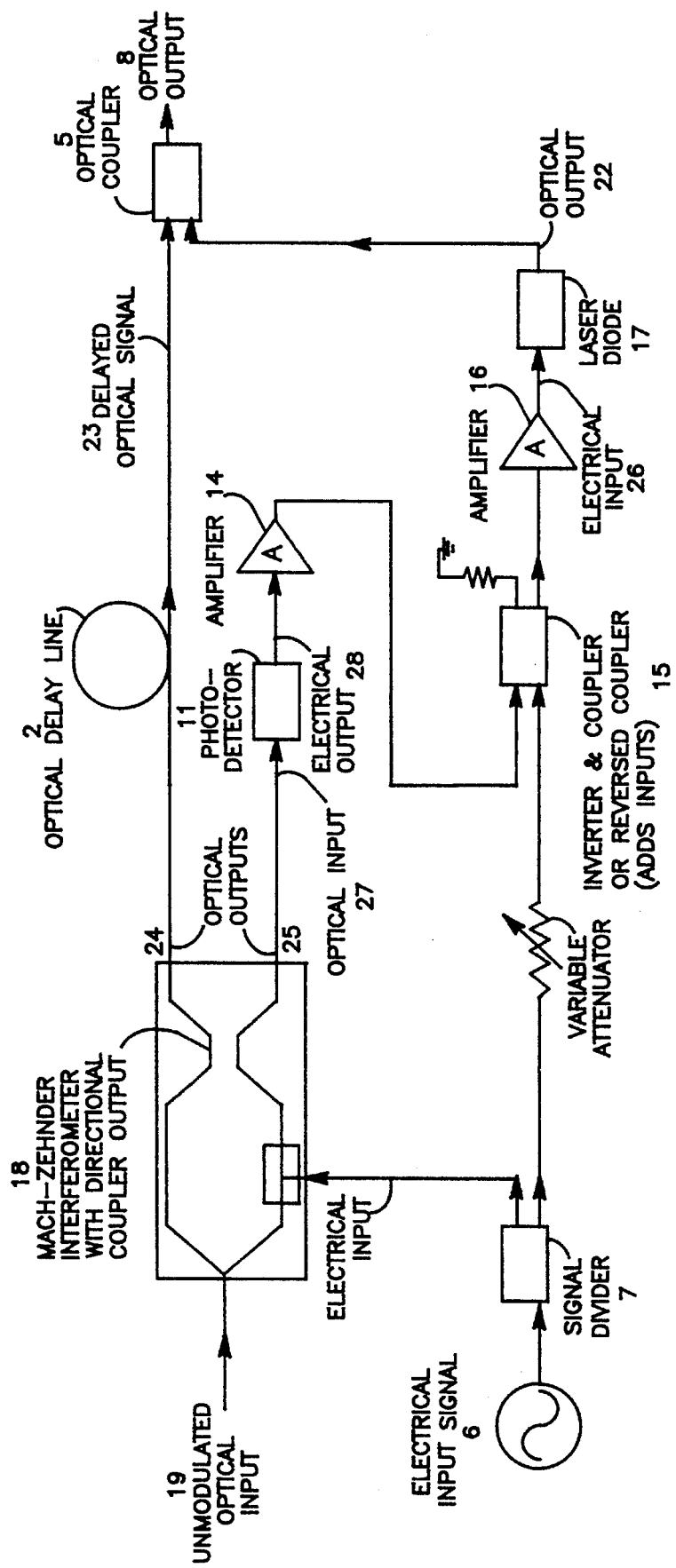

The "method of diverting a proportion of the input signal" referred to above can be either a conventional y-splitter 10, either using planar waveguides or optical fiber, or a directional coupler output on the Mach-Zehnder interferometer 18 (FIG. 3).

The unmodulated optical input 19 is obtained from, for example, a diode-pumped Nd-YAG laser operating at 1320 nm. This shows high output power and low noise. The second optical source 4 (e.g. diode laser 17) is chosen to have a different wavelength to the first optical source 1 (e.g 19, 9) to avoid coherent interference. As described below, it can have low power and high noise compared to the first optical input 19. The error signal generator 3 is an electrical directional coupler 15, e.g. mini-circuits TDC-10-2. As described below, other components are equally valid.

The object is to obtain a sufficiently linear transfer function with sufficient modulated optical power emitted from the system to overcome noise in both the transmitter and the eventual receiver, such that the required signal:noise ratio and linearity is obtained. The more nearly the transfer function approaches linear, the larger the amount of the total optical power that can be modulated for any given distortion level, and therefore the larger the eventual received electrical signal. Equally, for any fixed modulation depth, the larger the total optical power the larger the received modulated electrical signal.

The advantage of using a Mach-Zender waveguide interferometer 9 is that the total optical power 20 can be made arbitrarily large, independent of the modulation depth, as it does not depend on the modulator 9, but on the input light source 19. For the same reason, the noise associated with the optical signal 20 (relative intensity noise, R.I.N.) can be made arbitrarily small. However, the transfer function is not linear, but instead has the form L=1+cos V, where L is proportional to light amplitude, and V proportional to voltage 21. This limits the amount of modulated light for any given distortion.

The purpose of the invention is to generate an optical error signal 22 which is combined with the delayed optical signal 23 in such a way as to remove this distortion without significantly reducing the power and noise performance of the system, and in a cost effective manner.

This is achieved by the use of a high power, low noise laser as the input 19 to the first optical modulator 9, and a low power, relatively high noise laser diode 17 as the second modulatable source 4.

The method (10 (FIG. 2), or 18 (FIG. 3)) of diverting the optical signal and of combining 5 the delayed optical signal 23 with the optical error signal 22, is chosen such that the final optical output 8 consists mostly of light from the first optical source 19.

The two stages of amplification 14, 16 are chosen such that the error signal 22 is sufficiently large to cancel the distortion. This requires that the error signal 22 be a larger proportion of the total light output from the second optical source 4, (e.g. laser diode 17) than the distortion is a proportion of the total light from the first optical source 1 (e.g. 19, 9). It is advantageous that this second source 4 be more linear than the first 1, in order to faithfully reproduce this electrical error signal 26. However, as the distortion is typically at least 45 dB less than the signal, considerable amplification of the error signal is possible, even with a non-linear second optical source.

The noise contribution of the two sources 1, 4 to the final signal 8 is proportional to the amount of light from each source in the final output. As the second optical source 4 is a small fraction of the total output 8, it can exhibit a high relative intensity noise (R.I.N.) without degrading the final signal. This is an important feature of the invention.

The amplification 16 required is reduced if the second modulated light source 4 (e.g. 17) is a more efficient convertor of electrical signals 26 to optical signals 22 than the first light source 1. This is in general true of diode lasers compared to Mach-Zehnder modulators, for the same average light level.

The Mach-Zehnder modulator can also be utilised to maximize the optical power in the error signal and reduce the required amplification. If the y- coupler 10 of the interferometer is replaced by a X- switch (directional coupler) 18 (FIG. 3) the transfer function of the upper output 24 has the form 1+cos V, the lower arm 25 1–cos V. Therefore the required sample optical signal can be obtained from one arm 25 by simply inverting the detected optical signal 28, without reducing the amplitude of the output signal 24 in the other arm. (The inverting function can be performed by the directional coupler 15). This gives a sample signal 27 as large as the output signal 24.

It should be noted that wherever Mach-Zender interferometers are used it will be necessary in practice to use conventional feedback schemes to correct for drift of the bias point and period of the transfer function.

Figure 4:
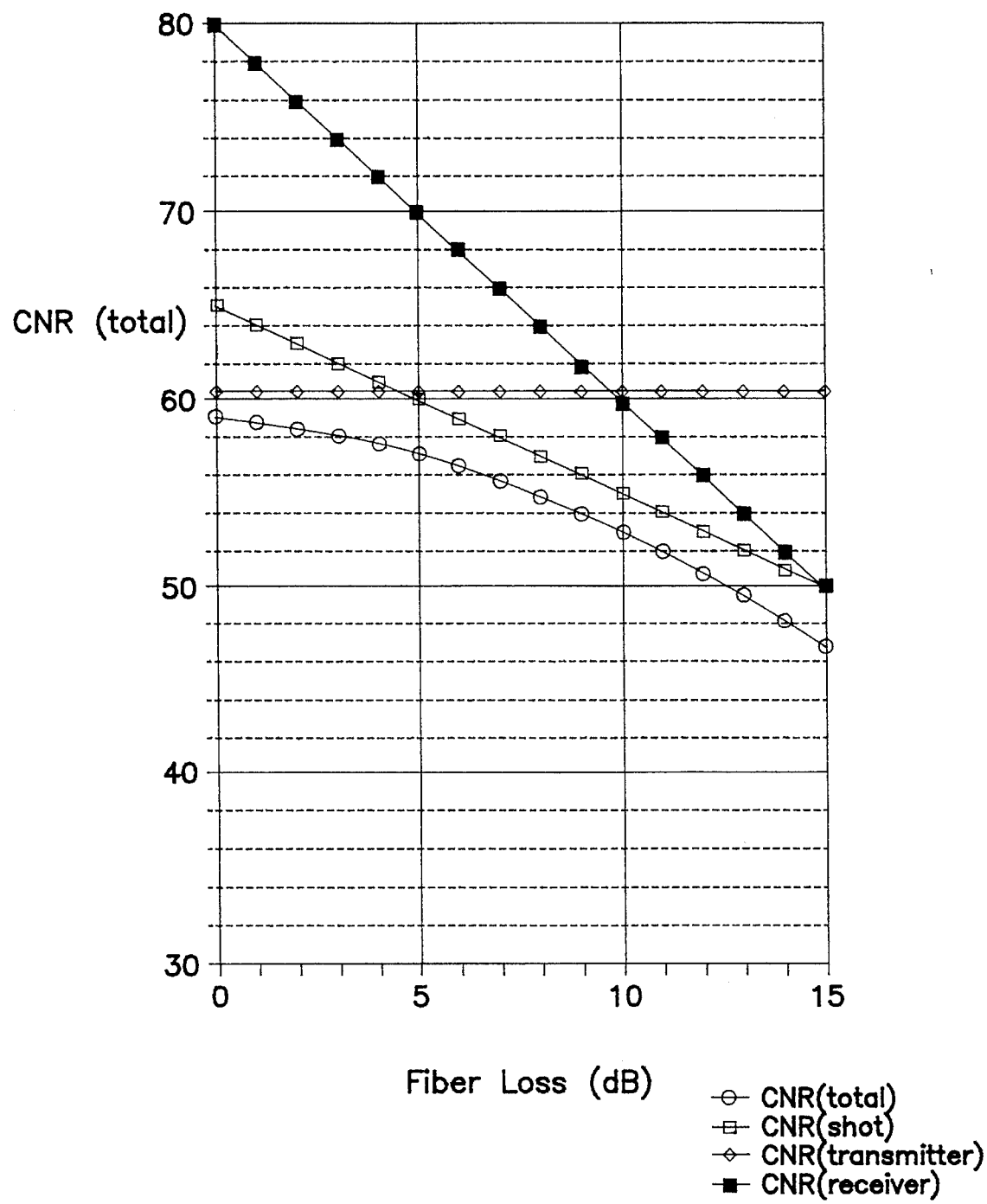
FIG. 4 is a graph showing the calculated performance of a particular example of the preferred embodiment of the invention.

The performance of a typical system is calculated in FIG. 4. The first optical source 19 launches 75 mW into a Mach-Zehnder modulator 9 with excess loss of 4.5 dB, and has a relative intensity noise of −165 dB/Hz. The second optical source 4 (laser diode 17) launches 1 mW and has a relative intensity noise of −135 dB/Hz. The couplers 10, 5 allow 45% of the output 20 from the first modulatable source through to the final signal 8, with the result that of a total launch power of 6.10 mW from the system, 6.00 mW are from the first source 19. This reduces the system noise contribution due to the R.I.N. of the second laser 17 to 11.6 dB below that due to the R.I.N. of the first laser 19, despite the second laser 17 having a much greater R.I.N. The dominant noise source in this example is the shot noise in the photodetector 11 in the error signal generator. FIG. 4 shows the calculated carrier:noise as a function of optical path loss for a 60 channel optical link consisting of the invention and a low noise optical receiver.

OTHER REFERENCES, ARTICLES, PATENTS

The overall scheme for reducing distortion by adding an error signal to the delayed output of a non-linear device resembles electrical feedforward schemes, and operates under the same constraints in terms of required phase and amplitude matching in the signal and error paths. The difference is the use of light, and optical components, rather than electricity. A second difference is the system is used to produce a modulated (optical) signal rather than amplify an existing modulated (optical) signal.

A "quasi-feedforward" approach using two modulated optical devices with identical transfer functions has been previously demonstrated with light emitting diodes (Strauss).

A feedforward approach using two identical optical sources, each consisting of a diode laser and a Mach-Zehnder interferometer, has recently been published (De Ridder). This exhibits unacceptable noise performance

DETAILED TECHNICAL DESCRIPTION

The prior art in fiber optic transmission systems has utilized a variety of different devices to perform the function of transforming the input electrical signal into the transmitted optical signal. Such devices include laser diodes, light emitting diodes and waveguide Mach-Zehnder interferometers. All of these devices have a non-ideal transfer function from electrical signal to optical signal. This leads to added distortion in the transmitted signal.

In the prior art, the presence of this added distortion meant that either a low specification had to be placed on the linearity of the complete system, reducing its area of application, or the electrical signal had to be first converted into a form that was insensitive to added distortion. Such forms include digital coding and frequency modulated subcarriers. This increased the cost of the complete system and restricted the format of the incoming signals that it was able to accept.

There exists a specific requirement for transmission of signals in cable television (CATV) systems in an amplitude modulated vestigial sideband (am-vsb) format, where the linearity requirements cannot be met by the prior art. This invention is designed to perform this function, but is equally applicable to the transmission of any modulated electrical signal through optical fiber.

The prior art also includes the demonstration of the technique of optical feedforward using two identical modulated optical sources. This was not capable of meeting the specific requirement for cable television systems.

The invention is shown in FIG. 1.

The invention comprises:

1) a first modulatable optical source with a non-ideal transfer function, such as a waveguide Mach-Zehnder interferometer or a laser diode;

2) an optical delay line to delay the output of the first optical modulator;

3) an error signal generator which compares the non-ideal signal from the first optical source with the original input signal and provides an error signal output;

4) a second, different, modulatable optical source which is modulated by the output of the error signal generator; and 5) an optical combiner, which combines the delayed optical signal from 1) with the modulated optical output from 4) in such a way that the departures from linearity (which form the error signal) are removed, giving a linear transfer function of electrical signal to light through the complete system.

The first optical source is chosen to have high power and low noise. The second source is chosen to be low power, moderate noise. The error signal generator and optical combiner are chosen such that most of the final optical output comes from the first optical source, giving a linear, high power, low noise optical signal at the output of the system.

PREFERRED EMBODIMENT

The preferred embodiment is shown in FIG. 2. It comprises:

1) A waveguide Mach-Zehnder interferometer.

2) Single mode optical fiber

3) A method to divert a proportion of the modulated light, followed by a detector to convert this to electric current, followed by an amplification stage, followed by a directional coupler to subtract a sample of the input signal, followed by a second amplifier to drive the second modulatable optical source.

4) A semiconductor diode laser

5) An optical coupler.

The "method of diverting a proportion of the input signal" referred to above can be either a conventional y-splitter, either using planar waveguides or optical fiber, or a directional coupler output on the Mach-Zehnder interferometer (FIG. 3).

The unmodulated optical input is obtained from, for example, a diode-pumped Nd-YAG laser operating at 1320 nm. This shows high output power and low noise. The second optical source (e.g. diode laser) is chosen to have a different wavelength to the first optical source, to avoid coherent interference. As described below, it can have low power and high noise compared to the first optical input. The error signal generator is an electrical directional coupler, e.g. mini-circuits TDC-10-2. As described below, other components are equally valid.

The object is to obtain a sufficiently linear transfer function with sufficient modulated optical power emitted from the system to overcome noise in both the transmitter and the eventual receiver, such that the required signal:noise ratio and linearity is obtained. The more nearly the transfer function approaches linear, the larger the amount of the total optical power that can be modulated for any given distortion level, and therefore the larger the eventual received electrical signal. Equally, for any fixed modulation depth, the larger the total optical power the larger the received modulated electrical signal.

The advantage of using a Mach-Zender waveguide interferometer in 1) is that the total optical power can be made arbitrarily large, independent of the modulation depth, as it does not depend on the modulator, but on the input light source. For the same reason, the noise associated with the optical signal (relative intensity noise, R.I.N.) can be made arbitrarily small. However, the transfer function is not linear, but instead has the form $L=1+\cos V$, where L is proportional to light amplitude, and V proportional to voltage. This limits the amount of modulated light for any given distortion.

The purpose of the invention is to generate an optical error signal which is combined with the delayed optical signal in such a way as to remove this distortion without significantly reducing the power and noise performance of the system, and in a cost effective manner.

This is achieved by the use of a high power, low noise laser as the input to the first optical modulator, and a low power, relatively high noise laser diode as the second modulatable source.

The method of diverting the optical signal, and of combining the delayed optical signal with the optical error signal, is chosen such that the final optical output consists mostly of light from the first optical source.

The two stages of amplification are chosen such that the error signal is sufficiently large to cancel the distortion. This requires that the error signal be a larger proportion of the total light output from the second optical source than the distortion is a proportion of the total light from the first optical source. It is advantageous that this second source be more linear than the first, in order to faithfully reproduce this error signal. However, as the distortion is typically at least 45 dB less than the signal, considerable amplification of the error signal is possible, even with a non-linear second optical source.

The noise contribution of the two sources to the final signal is proportional to the amount of light from each source in the final output. As the second optical source is a small fraction of the total output, it can exhibit a high relative intensity noise (R.I.N.) without degrading the final signal. This is an important feature of the invention.

The amplification required is reduced if the second modulated light source is a more efficient convertor of electrical signals to optical signals than the first light source. This is in general true of diode lasers compared to Mach-Zehnder modulators, for the same average light level.

The Mach-Zehnder modulator can also be utilised to maximize the optical power in the error signal and reduce the required amplification. If the y- coupler of the interferometer is replaced by a X- switch (FIG. 3) the transfer function of the upper output has the form 1+cos V, the lower arm 1−cos V. Therefore the required sample optical signal can be obtained from one arm by simply inverting the detected optical signal, without reducing the amplitude of the output signal in the other arm. (The inverting function can be performed by the directional coupler). This gives a sample signal as large as the output signal.

It should be noted that wherever Mach-Zender interferometers are used it will be necessary in practice to use conventional feedback schemes to correct for drift of the bias point and period of the transfer function.

The performance of a typical system is calculated in FIG. 4. The first optical source launches 75 mW into a Mach-Zehnder modulator with excess loss of 4.5 dB, and has a relative intensity noise of −165 dB/Hz. The second optical source (laser diode) launches 1 mW and has a relative intensity noise of −135 dB/Hz. The couplers allow 45% of the output from the first modulatable source through to the final signal, with the result that of a total launch power of 6.10 mW from the system, 6.00 mW are from the first source. This reduces the system noise contribution due to the R.I.N. of the second laser to 11.6 dB below that due to the R.I.N. of the first laser, despite the second laser having a much greater R.I.N. The dominant noise source in this example is the shot noise in the photodetector in the error signal generator. FIG. 4 shows the calculated carrier:noise as a function of optical path loss for a 60 channel optical link consisting of the invention and a low noise optical receiver.

OTHER REFERENCES, ARTICLES, PATENTS

The overall scheme for reducing distortion by adding an error signal to the delayed output of a non-linear device resembles electrical feedforward schemes, and operates under the same constraints in terms of required phase and amplitude matching in the signal and error paths. The difference is the use of light, and optical components, rather than electricity. A second difference is the system is used to produce a modulated (optical) signal rather than amplify an existing modulated (optical) signal.

A "quasi-feedforward" approach using two modulated optical devices with identical transfer functions has been previously demonstrated with light emitting diodes (Strauss).

A feedforward approach using two identical optical sources, each consisting of a diode laser and a Mach-Zehnder interferometer, has recently been published (De Ridder). This exhibits unacceptable noise performance for cable television, due to the low launch power and high noise of diode lasers. It would not be possible, without modification, to implement such a system with diode-pumped high power, low noise Nd-YAG lasers. This is because coherent interference at the optical combiner from two such lasers of the same wavelength would add noise to the signal. This could be avoided by the addition of wavelength selective elements to the Nd-YAG cavity, but this, and the use of two Nd-YAG lasers instead of one, significantly increase the cost of the system compared to the invention described here.

I claim:

1. A method for reducing distortion in an optical transmission system, comprising:

a) a first modulatable optical source with a non-ideal transfer function, exhibiting high power and low noise;

b) an optical delay line to delay the output of the first optical modulator;

c) an error signal generator which compares the non-ideal signal from the first optical source with the original input signal and provides an error signal output;

d) a second, different, modulatable optical source exhibiting low power and moderate noise, which is modulated by the output of the error signal generator; and e) an optical combiner, which combines the delayed optical signal from a) with the modulated optical output from d) in such a way that the departures from linearity (which form the error signal) are removed, giving a linear transfer function of electrical signal to light through the complete system; the error signal generator and optical combiner are chosen such that most of the final optical output comes from the first optical source, giving a linear, high power, low noise optical signal at the output of the system.

2. The method of claim 1 where the first modulatable optical source is a waveguide Mach-Zehnder interferometer and a Nd-YAG diode pumped laser.

3. The method of claim 1 where the second optical modulator is a laser diode.

4. The method of claim 1 where the error generator is a photodetector followed by an amplifier and electrical directional coupler.

5. The method of claim 1 where the Mach-Zender optical modulator is biased at its most linear region by means of a feedback loop and a test signal.

6. A transmission system comprising the method of claim 1, an optical fiber transmission path, and a remote detector.

* * * * *